(12) United States Patent
De Vries et al.

(10) Patent No.: US 8,445,897 B2
(45) Date of Patent: May 21, 2013

(54) METHOD FOR MANUFACTURING A MULTI-LAYER STACK STRUCTURE WITH IMPROVED WVTR BARRIER PROPERTY

(75) Inventors: Hindrik Willem De Vries, Tilburg (NL); Mauritius Cornelius Maria Van de Sanden, Tilburg (NL)

(73) Assignee: Fujifilm Manufacturing Europe B.V., Tilburg (NL)

( * ) Notice: Subject to any disclaimer, the term of this patent is extended or adjusted under 35 U.S.C. 154(b) by 384 days.

(21) Appl. No.: 12/866,704

(22) PCT Filed: Jan. 22, 2009

(86) PCT No.: PCT/NL2009/050027
§ 371 (c)(1),
(2), (4) Date: Nov. 4, 2010

(87) PCT Pub. No.: WO2009/099325
PCT Pub. Date: Aug. 13, 2009

(65) Prior Publication Data
US 2011/0049491 A1  Mar. 3, 2011

(30) Foreign Application Priority Data
Feb. 8, 2008  (EP) .................................... 08151215

(51) Int. Cl.
*H01L 35/24*  (2006.01)
(52) U.S. Cl.
USPC ................... 257/40; 257/E51.001; 438/99
(58) Field of Classification Search
USPC ................... 257/40, E51.001; 438/99
See application file for complete search history.

(56) References Cited

U.S. PATENT DOCUMENTS

| 4,478,878 A | 10/1984 | Neuwald |
| 4,631,199 A | 12/1986 | Hall et al. |
| 4,681,780 A | 7/1987 | Kamman |
| 5,187,457 A | 2/1993 | Chawla et al. |
| 5,576,076 A | 11/1996 | Slootman et al. |

(Continued)

FOREIGN PATENT DOCUMENTS

| DE | 10 2004 043 384 A1 | 3/2006 |
| EP | 0 889 506 A2 | 1/1999 |

(Continued)

OTHER PUBLICATIONS

Lee, et al.—"Investigation of Silicon Oxide Thin Films Prepared by Atomic Layer Deposition using SiH2Cl2 and O3 as the Precursors"—Japanese Journal of Applied Physics, vol. 43, No. 3A, 2004, pp. L328-L330.

(Continued)

*Primary Examiner* — Anthony Ho
(74) *Attorney, Agent, or Firm* — Gilberto M. Villacorta; Sunit Talapatra; Foley & Lardner LLP

(57) ABSTRACT

A method and apparatus for manufacturing a multi-layer stack structure (12), the structure (12) comprising in order: a substrate (6a) a barrier layer (14) an adhesive layer (15) a barrier layer (14) a substrate (6b). The method comprises: a) providing two substrates (6a, 6b) in a single treatment space (5), the treatment space (5) comprising at least two electrodes (2, 3) for generating an atmospheric pressure glow discharge plasma in the treatment space (5); b) treating the facing surfaces of the two substrates (6a, 6b) simultaneously in the single treatment space (5); c) laminating the two treated substrates (6a, 6b) with an adhesive layer (15) in between the facing surfaces to obtain the multi-layer stack structure (12).

12 Claims, 2 Drawing Sheets

U.S. PATENT DOCUMENTS

| | | | |
|---|---|---|---|
| 6,413,645 | B1 | 7/2002 | Graff et al. |
| 6,464,779 | B1 | 10/2002 | Powell et al. |
| 6,534,421 | B2 | 3/2003 | Kakkad |
| 6,613,394 | B2 | 9/2003 | Kuckertz et al. |
| 6,652,924 | B2 | 11/2003 | Sherman |
| 6,756,318 | B2 | 6/2004 | Nguyen et al. |
| 6,774,569 | B2 | 8/2004 | De Vries et al. |
| 6,835,425 | B2 | 12/2004 | Fukuda et al. |
| 6,861,334 | B2 | 3/2005 | Raaijmakers et al. |
| 7,098,131 | B2 | 8/2006 | Kang et al. |
| 7,298,072 | B2 | 11/2007 | Czeremuszkin et al. |
| 7,491,429 | B2 | 2/2009 | De Vries et al. |
| 7,533,628 | B2 | 5/2009 | Bewig et al. |
| 7,709,159 | B2 | 5/2010 | Umetsu et al. |
| 2002/0150839 | A1 | 10/2002 | Peng |
| 2004/0146660 | A1 | 7/2004 | Goodwin et al. |
| 2005/0079418 | A1 | 4/2005 | Kelley et al. |
| 2005/0084610 | A1 | 4/2005 | Selitser |
| 2006/0231908 | A1 | 10/2006 | Liu et al. |
| 2008/0317974 | A1 | 12/2008 | De Vries et al. |
| 2009/0238997 | A1 | 9/2009 | De Vries et al. |
| 2009/0304949 | A1 | 12/2009 | De Vries et al. |
| 2009/0324971 | A1 | 12/2009 | De Vries et al. |
| 2010/0147794 | A1 | 6/2010 | De Vries et al. |
| 2011/0014424 | A1 | 1/2011 | De Vries |
| 2011/0042347 | A1 | 2/2011 | Korngold et al. |
| 2011/0089142 | A1 | 4/2011 | Korngold et al. |

FOREIGN PATENT DOCUMENTS

| | | |
|---|---|---|
| EP | 1 340 838 A1 | 9/2003 |
| EP | 1 351 321 A2 | 10/2003 |
| EP | 1 381 257 A2 | 1/2004 |
| EP | 1 383 359 A2 | 1/2004 |
| EP | 1 403 902 A1 | 3/2004 |
| EP | 1 029 702 B1 | 4/2004 |
| EP | 1 548 795 A1 | 6/2005 |
| EP | 1 626 613 A1 | 2/2006 |
| EP | 1 750 294 A1 | 2/2007 |
| EP | 1 371 752 B1 | 5/2008 |
| JP | 58-111380 A | 7/1983 |
| JP | 58-217344 A | 12/1983 |
| JP | 64-033932 A | 2/1989 |
| JP | 04-094169 A | 3/1992 |
| JP | 07-074110 A | 3/1995 |
| JP | 2000-026632 A | 1/2000 |
| JP | 2000-313962 A | 11/2000 |
| JP | 2003-206361 A | 7/2003 |
| JP | 2006-004740 A | 1/2006 |
| WO | WO 99/04411 | 1/1999 |
| WO | WO-01/15220 A1 | 3/2001 |
| WO | WO-01/69644 A1 | 9/2001 |
| WO | WO-03/005461 A1 | 1/2003 |
| WO | WO-2004/019381 A2 | 3/2004 |
| WO | WO-2004/030019 A1 | 4/2004 |
| WO | WO-2005/033189 A1 | 4/2005 |
| WO | WO-2005/049228 A2 | 6/2005 |
| WO | WO-2005/062337 A1 | 7/2005 |
| WO | WO-2005/062338 A1 | 7/2005 |
| WO | WO-2007/013703 A1 | 2/2007 |
| WO | WO-2007/024134 A1 | 3/2007 |
| WO | WO-2007/078556 A1 | 7/2007 |
| WO | WO 2007/089146 A1 | 8/2007 |
| WO | WO-2007/091891 A1 | 8/2007 |
| WO | WO 2007/139379 A1 | 12/2007 |
| WO | WO-2007/145513 A1 | 12/2007 |
| WO | WO-2008/100139 A1 | 8/2008 |
| WO | WO-2009/096785 A1 | 8/2009 |
| WO | WO-2010/092384 A1 | 8/2010 |

OTHER PUBLICATIONS

International Search Report mailed in Mar. 3, 2009 received in International application No. PCT/NL2009/050027.

Affinito et al., "A new method for fabricating transparent barrier layers," Thin Solid Films, vols. 290-291, 1996, pp. 63-67.

Babayan et al., "Deposition of silicon dioxide films with an atmospheric-pressure plasma jet," Plasma Sources Sci. Technol., vol. 7, 1998, pp. 286-288.

Bletzinger et al., "The effect of displacement current on fast-pulsed dielectric barrier discharges," J Phys D Appl Phys, vol. 36, No. 13, 2003, pp. 550-1552.

Buss et al., "Synthesis of Silicon Nitride Particles in Pulse Radio Frequency Plasmas," J Vac Sci Technol.A, vol. 14, No. 2, 1996, pp. 577-581 [XP-002391555].

Gherardi et al., "A new approach to SiO2 deposit using a N2-SiH4-N2O glow dielectric barrier-controlled discharge at atmospheric pressure," J.phys. D: Appl. Phys., vol. 33, 2000, pp. L104-L108.

Martin et al., "Atmospheric pressure PE-CVD of silicon based coatings using a glow dielectric barrier discharge," Surface and Coatings Technology, 177-178, 2004, pp. 693-698.

Watanabe et al., "Formation Kinetics and Control of Dust Particles in Capacitively-Coupled Reactive Plasmas," Physica Scripta, vol. T89, 2001, pp. 29-32 [XP008066859].

METHOD FOR MANUFACTURING A MULTI-LAYER STACK STRUCTURE WITH IMPROVED WVTR BARRIER PROPERTY

This is a National Stage application of PCT/NL2009/050027, filed Jan. 22, 2009, which claims priority to Europe Patent Application No. 08151215.4, filed Feb. 8, 2008. The foregoing applications are incorporated by reference herein in their entirety.

TECHNICAL FIELD

The present invention relates to a method for manufacturing a multi-layer stack structure, the structure comprising in order:
a substrate—a barrier layer—an adhesive layer—a barrier layer—a substrate.

Furthermore, this invention relates to a device, e.g. an OLED device comprising such a multi-layer stack structure.

In an even further aspect, the present invention relates to an apparatus for producing a multi-layer stack structure, the apparatus comprising a treatment space with at least two electrodes connected to a plasma control unit for generating an atmospheric pressure glow discharge plasma in the treatment space, and a gas supply device in communication with the treatment space for providing compounds (gases and precursors) in the treatment space.

BACKGROUND ART

International patent application WO99/04411 discloses plasma treatment systems and treatment methods, in which a substrate web is treated using cylindrical cavity electrodes. Direct plasma treatment and remote plasma treatment arrangements are disclosed. Treating two substrate surfaces simultaneously is performed using two different plasma treatment arrangements in a single enclosure (see embodiment of FIG. 13).

Heretofore, a gas-barrier film fabricated by forming a thin metal oxide film of aluminum oxide, magnesium oxide or silicon oxide on the surface of a plastic substrate or a film is widely used for wrapping or packaging articles that require shielding from various gases such as water vapor or oxygen and for wrapping or packaging edibles, industrial articles and medicines for preventing them from being deteriorated. Apart from its applications for wrapping and packaging articles, in addition, the gas-barrier film is being used for substrates for liquid-crystal display devices, solar cells and EL devices. In particular, a transparent substrate that is being much used for liquid-crystal display devices and EL devices is required to be lightweight and has a large panel and, in addition, it is further required to satisfy high-level performance ability in that it has long-term reliability and has a lot of latitude in designing its shape and that it enables curved-face display.

Recently, in the field of liquid-crystal display devices and EL devices, a film substrate of transparent plastics or the like is being used in place of a glass substrate that is heavy and readily cracked or broken and hardly worked into a large-size panel. In addition, since the film substrate of transparent plastics or the like satisfies the above-mentioned requirements and since it is applicable to a roll-to-roll system, it is more advantageous than glass in that the producibility with it is high and the production cost with it is low. However, the film substrate of transparent plastics or the like is problematic in that its gas-barrier property is not good as compared with that of glass. When a substrate having a poor gas-barrier property is used, water vapor and air may penetrate through it; and, for example, when it is used in liquid-crystal display devices, the liquid crystal in the liquid-crystal cell may be degraded and the degraded part may be a display failure, thereby worsening the display quality of the devices.

It is known to form a thin metal oxide film on the above-mentioned film substrate, thereby using the resulting gas-barrier film as a transparent substrate. As a gas-barrier film for use in wrapping materials and liquid-crystal display devices, there are known a plastic film coated with silicon oxide through vapor deposition (for example, see JP-4904169, pp. 1-3), and a plastic film coated with aluminium oxide through vapor deposition (for example, see JP-A-58-217344, pp. 1-4). These have a water-vapor barrier level of about 1 $g/m^2 \cdot day$. However, with recent development of large-panel liquid-crystal display devices and high-definition display devices, the film substrate is being required to have a water-vapor barrier level of about 0.1 $g/m^2 \cdot day$.

Recently, the development of organic EL devices and high-definition color liquid-crystal display devices that are required to have a higher gas-barrier level is being further promoted, and a substrate that keeps a transparency applicable to them and has a higher gas-barrier level, especially a higher water-vapor barrier level of not more than 0.01 $g/m^2 \cdot day$ is being required.

To satisfy these requirements, some methods expected to produce a higher gas-barrier level have been investigated, for example, a sputtering method of forming a thin film by the use of a plasma generated through glow discharge under low pressure, and a CVD method for film formation. In addition, an attempt to change laminate structure formation to attain a desired result is tried (for example, see JP-A-2003-206361, pp. 2-3).

However, when a film substrate is used, the substrate temperature is limited in layer formation thereon, and therefore a barrier layer having a sufficiently dense and tight structure could not be formed, and a film having a satisfactory barrier property capable of satisfying the requirements could not as yet be formed.

As a thin-film material having a good barrier property, a silicon nitride and a silicon oxinitride are used, and laminating them is tried. For example, U.S. Pat. No. 6,413,645 B1 (p. 4 [2-54] to p. 8 [8-22]) describes a barrier film fabricated by laminating, on a substrate film, two layers of a silicon oxinitride having a different nitrogen/oxygen constitution ratio. However, the constitution could not satisfy both a sufficient gas-barrier level and a bending resistance which the film substrate must have in its use, and further technical improvement on it is desired.

On the other hand, a technique of producing a barrier film having an alternate laminate structure of an organic layer/inorganic layer according to a vacuum evaporation method is proposed (for example, see Affinito et al., Thin Solid Films, 1996, P. 290-291 (pp. 63-67)), and it gives a barrier film useable as for a film substrate for organic EL devices.

However, the adhesiveness between the organic layer and the inorganic layer is not always satisfactory, and a multi-layered structure of at least 6 layers is needed for providing a high-reliability barrier film for organic EL devices.

Another method is described in international patent publication WO03/005461 wherein two polymer-inorganic multi-layer materials in opposed facing relationship are sandwiched displaying good barrier properties. The deposition of the inorganic layer is done in very complicated vacuum pressure plasma process in order to suppress contaminations and defects.

In the art of manufacturing and commercialization of flexible thin substrate material for OLED devices displaying excellent barrier properties a more cost-effective and a simpler process are desired.

DISCLOSURE OF THE INVENTION

The present invention provides an effective, efficient and cheap process for manufacturing of flexible multi-layer material with excellent barrier property to water vapour. Furthermore, this invention provides flexible multi-layer material with an excellent barrier property to water vapour.

In accordance with one aspect of the invention there is provided a method as described in the introduction above, the method comprising:
a) providing two substrates in a single treatment space, the single treatment space being formed between at least two electrodes for generating an atmospheric pressure glow discharge plasma in the single treatment space;
b) treating the facing surfaces of the two substrates simultaneously in the single treatment space;
c) laminating the two treated substrates with an adhesive layer in between the facing surfaces to obtain the multi-layer stack structure.

By simultaneously treating two substrates in the single treatment space and subsequent laminating of the two substrates, a very efficient production process is obtained resulting in a multi-layer stack structure having very good water vapour transmission rate characteristics. Furthermore, the chance of impurities or other contaminations reaching the substrates before laminating is reduced. Also, a more uniform treatment of the substrates is achieved when using a single treatment space. It has been found that the present method may be applied to improve certain characteristics when applying layers of material to the two substrates (films or foils) and after laminating these into one multi-layer stack structure (again a roll of film or foil). Using the present invention embodiments allows to provide for deposition rates of more than 1 nm/s, e.g. 5 nm/s or even 10 nm/s.

In a further embodiment, the method further comprises laminating two or more multi-layer stack structures with an additional adhesive layer in between. By further stacking multi-layer stack structures, the WVTR characteristics may be even further improved.

The substrates are provided as sheets to obtain the multi-layer stack structure in a continuous process. For example, the substrates may be provided from two rolls with a predetermined width, and the laminated structure may be spooled on a receiving roll. This two roll to one roll process is very efficient for continuous manufacturing of the multi-layer stack structure, by adhering the two treated substrates with the treated surfaces facing each other by lamination into one roll using an adhesive.

In a further embodiment, the substrates are organic resin films. Examples of such organic resin films (of polymer materials) include, but are not limited to PEN (PolyEthylene Naphtalate), PET (PolyEthylene Teraphtalate), PC (PolyCarbonate), COP (Cyclic Olefin Polymer), COC (Cyclic Olefin CoPolymer), etc. The thickness of the substrates may be between 20 and 800 µm, e.g. 50 µm or 200 µm.

The step of treating the facing surfaces comprises in a further embodiment depositing an inorganic material on the substrate surface to form the barrier layer, e.g. an SiOx layer.

In a further embodiment, the step of treating the facing surfaces is executed with a duty cycle above 10%, preferably above 60%. This effectively reduces the formation of dust when depositing the inorganic layer on the substrates.

An atmospheric pressure glow discharge is generated in a further embodiment by applying electrical power from a power supply to the at least two electrodes in the treatment space during an on-time ($t_{on}$), the treatment space being filled with a gas composition, including a precursor of the chemical compound or element to be deposited, wherein the gas composition comprises an amount of nitrogen between 1 and 99.99% and an amount of oxygen between 0.01 and 25%. Again, this reduces the chance of formation of dust in the deposition step and an improvement of the quality of the deposited layer.

In a further aspect, the present invention relates to a device comprising a multi-layer structure obtained according to the present method embodiments, e.g. an OLED device.

In an even further aspect, the present the present invention relates to an apparatus as defined in the introduction above, in which the treatment space is a single treatment space formed between the at least two electrodes, and the apparatus further comprising a feeder system for providing two substrates simultaneously in the single treatment space for treatment using the generated atmospheric pressure glow discharge plasma, and a laminating system for laminating the two treated substrates with an adhesive layer in between.

SHORT DESCRIPTION OF THE FIGURES

The present invention will be discussed in more detail below, using a number of exemplary embodiments, with reference to the attached drawings, in which FIG. 1 shows a schematic view of a plasma generation apparatus in which the present invention may be embodied;

DETAILED DESCRIPTION OF THE INVENTION

Figure 1:
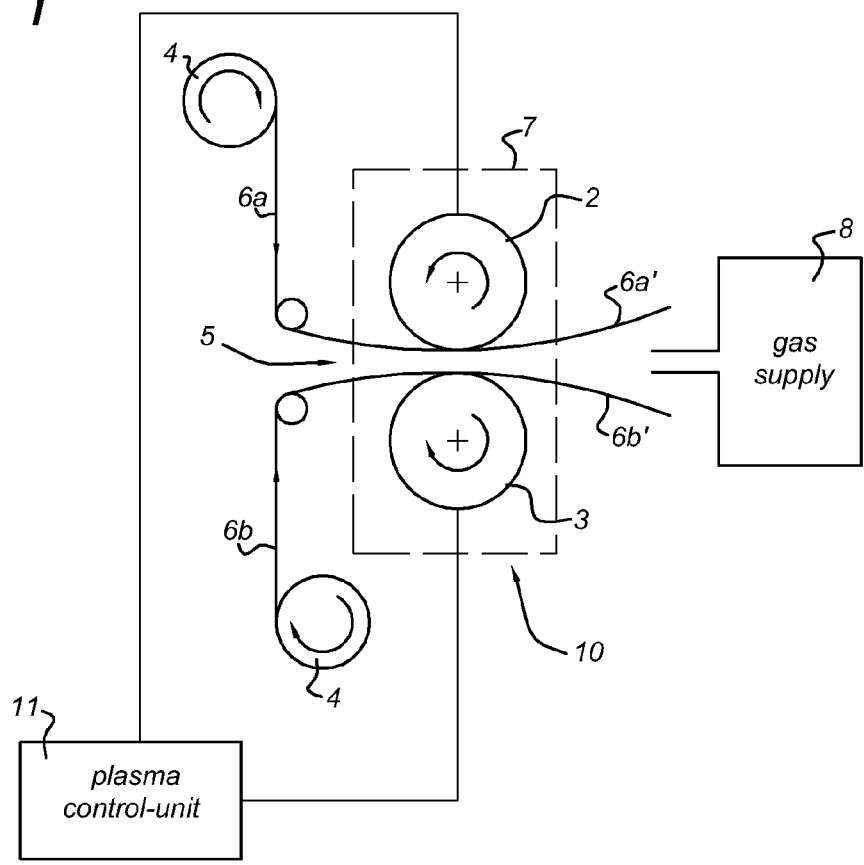

FIG. 1 shows a schematic view of a plasma apparatus 10 in which the present invention may be applied. A treatment space 5, which may be a treatment chamber within an enclosure 7, or a treatment space 5 with an open structure, comprises two curved electrodes 2, 3, e.g. cylinder electrodes. In general the electrodes 2, 3 are provided with a dielectric barrier in order to be able to generate and sustain a glow discharge at atmospheric pressure in the treatment space 5. Alternatively, a plurality of electrodes 2, 3 is provided.

The electrodes 2, 3 may be mounted to allow rotation in operation, e.g. using a mounting shaft and/or bearing arrangements. The electrode 2, 3 may be provided as a rolling electrode 2, 3 which is freely rotating or may be driven at certain angular speed using controller and drive units (which as such are known to the skilled person).

Two substrates 6a, 6b may be treated in the single treatment space 5 simultaneously, effectively enhancing the throughput of the plasma apparatus 10. The substrates 6a, 6b may be provided in the treatment space 5 from a respective roll 4, allowing a continuous feed of the substrates 6a, 6b to the treatment space 5. Treated substrates 6a', 6b' leave the treatment space 5 for further processing or e.g. for storage.

Treating the two substrates 6a, 6b in the same treatment space 5 simultaneously provides a more uniform plasma treatment as compared to the application of using separate treatment processes for each substrate 6a, 6b.

The formation of a glow discharge plasma may be stimulated by controlling the displacement current (dynamic matching) using a plasma control unit 11 connected to the electrodes 2, 3, leading to a uniform activation of the surface of substrate 6a, 6b in the treatment space 5. The plasma control unit 11 e.g. comprises a power supply and associated control circuitry as described in the pending international patent application PCT/NL2006/050209, and European patent applications EP-A-1381257, EP-A-1626613 of applicant, which are herein incorporated by reference.

The invention further relates to a method of manufacturing a multi-layer stack structure (e.g. on the surface of substrate 6a, 6b as shown in FIG. 1) providing an excellent permeation barrier to water vapour to be used in several different devices. Furthermore, the invention relates to a multi-layer structure providing excellent barrier properties against water vapour.

In order to quantify water vapour transmission rates for barrier films two different measurements may be used. A first measurement is done using the Mocon Aquatran which uses a coloumbmetric cell (electrochemical cell) with a minimum detection limit of $5*10^{-4}$ g/m$^2$·day. This method provides a more sensitive and accurate permeability evaluation than the permeation measurement by using IR absorption (known to the person skilled in the art). Measurement conditions can be varied from 10-40° C. and also relative humidity usually from 60-90%.

Secondly, to perform even more sensitive permeation measurements a calcium corrosion test was carried out under the conditions of 40° C. and 90% RH. Basically, calcium is evaporated on a test substrate and then a glass slide is attached to cover the calcium layer. Then this obtained sample is exposed to 40° C. and 90% RH, while monitoring the light absorption from the sputtered calcium layer.

The optical density (OD) of a film is proportional to the thickness so we can calculate the WVTR via the following equation:

$$WVTR = -2A \frac{M[H_2O]}{M[Ca]} \rho_{Ca} \frac{L_{Ca} W_{Ca}}{L_s W_s} \frac{d(OD)}{dt}$$

where A is the scaling factor between calcium thickness and OD, M[H2O], and M[Ca] are the molar masses of water and Ca with values of 18 and 40.1 units respectively, $\rho_{Ca}$ is the density of calcium, $L_{Ca}$ and $W_{Ca}$ are the length and width of the deposited Ca, Ls and Ws are the length and width of the permeation area defined by the interior boundary, d(OD)/dt is the slope of the measured optical absorbance versus time.

Surprisingly, it has been observed that after i) deposition of an inorganic barrier layer (e.g. SiO$_2$) on the two organic resin (e.g. PE) substrates 6a/6b as shown schematically in FIG. 1 by using an atmospheric pressure glow discharge plasma in one treatment space 5, in which an atmospheric pressure glow discharge is generated by applying electrical power from a power supply 11 to at least two electrodes 2, 3 in the treatment space 5, the treatment space 5 being filled with a gas composition, including a precursor of the chemical compound or element to be deposited, wherein the gas composition comprises an amount of nitrogen between 1 and 99.99% and an amount of oxygen between 0.01 and 25% and after ii) lamination of the two rolls of [resin-inorganic barrier]-layers 6a, 6b with an adhesive 15, it is possible to prepare a multi-layer stack structure 12 with far better water vapour barrier properties when using of a plasma deposition process in vacuum. This is described in more detail with reference to FIG. 3 below.

In particular this multi-layer stack structure 12 can be used as over- and/or underlayer material protecting and/or enveloping organic light emitting diode (OLED) devices.

In the treatment space 5, a combination of gasses is introduced from a gas supply device 8, including a pre-cursor. The gas supply device 8 may be provided with storage, supply and mixing components as known to the skilled person. The purpose is to have the precursor decomposed in the treatment space 5 to a chemical compound or chemical element which is deposited on the surfaces of the two substrates 6a, 6b.

In general the combination of gases comprises besides the precursor an active gas like for example oxygen and a mixture of inert gases. When using such embodiments in general dust formation is observed after very short deposition times and a smooth dust-free deposition cannot be obtained. In plasmas used for high quality applications (microelectronics, permeation barrier, optical applications) dust formation is a serious concern. For such applications the dust formation can compromise the quality of the coating. At atmospheric pressure dust formation is a common fact, due to the typical large power density of the plasma and large concentrations of reactive molecules. For this reason the industrial use of atmospheric plasmas for coating applications is presently limited to low-end applications such as increasing adhesion. With respect to the mechanism of dust formation in plasma at atmospheric pressure, it is assumed that the clustering seeds for dust formation are negative and positive ions formed by the dissociation of reactive molecules. In order to prevent dust formation it is necessary to limit the dissociation of molecules by plasma in order to avoid excessive degradation of the molecules or the formation of macro polymers in the plasma. The use of low pressure plasma is one method to achieve this. At low pressure the ions can not survive more than few milliseconds after the plasma is extinguished and at low pressure the dust particles grow relatively slow (about 10 s) to become of significant size. Pulsing the power is another standard way to diminish the plasma reactivity by decreasing the average energy transferred to the plasma per unit of time.

In general, in pulsed plasmas the standard method for suppression of dust formation is based on the fast decay of dust coagulation centres during the power off-time of the plasma. This can be regarded as a "natural death" of dust during the plasma off-time. At low pressure plasmas only a short period of power off-time is needed so that the power on-time can be relatively long (in the order of hundreds of ms). The duty cycle, defined as the power on time divided by the sum of the power on and power of time of these pulsing examples is large, typically in the range of 50-98%. Pulsing the plasma with an off-time of a few milliseconds is enough to interrupt the growth of dust particles and to limit thus the dust formation.

Without being bound to theory the present invention is not based on the "natural dead" (decay) of dust coagulation centers but on minimizing their density in plasma so from the stage of Power on-time. To the contrary of standard method which is a manipulation of dust formation based on the decay of coagulation centers via adjustment of Power off-time this is rather a method based on preventing from the beginning the formation of the coagulation centers.

At atmospheric pressure high duty cycles could not be obtained until now. At atmospheric pressure duty cycles of less than 5% (for example 1%) were the maximum duty cycles achievable. Pulsing at atmospheric pressure is required to suppress dust formation but has the disadvantage of a slower treatment of a surface. So a low duty cycle is an option only for a limited range of gas mixtures provided that the density of reactive radicals reduces to almost 0 during plasma off-time. In the present invention we have now surprisingly found, that the duty cycle at atmospheric pressure can be increased significantly to values over 5% and even more than 10% for example 15% or 20%. As stated before in the treatment space 5 a combination of gases is introduced comprising a precursor an active gas for example oxygen and a combination of inert gases. For most of the inert gas compositions a critical oxygen concentration can be identified below which the precursor will not decompose completely anymore, giving a deposition comprising the chemical compound or element to be deposited and the precursor or not completely decomposed precursor molecules. For the system hexamethyldisiloxane (HMDSO) as precursor, oxygen as the active gas and argon as the inert gas for example we found, that below the critical oxygen limit of 1.3% no complete decomposition of the HMDSO could be obtained.

To our surprise we found that addition of nitrogen to the gas mixture increases the efficiency of oxygen significantly which gives as big advantage that the dust formation is suppressed. The efficiency of deposition is increased when using nitrogen compared to the deposition without the use of nitrogen meaning that at the same active gas concentration the deposition is much more efficient and at higher active gas concentrations the formation of dust is suppressed. The use of very low amounts of oxygen gives, from a chemical point of view, homogeneous deposition and duty cycles can be obtained higher than 5% even higher than 10% for example 20%, 50%, 60%, 70%, 80% or even 98% without or with only a very limited amount of dust formation. In one embodiment besides the precursor the gas composition comprises oxygen and nitrogen. Oxygen can be used for example from 0.01 to 25% of the gas composition and the gas composition can further comprise nitrogen in an amount from 99.99% to 1%. In addition to nitrogen the gas composition may comprise a noble gas like helium, neon or argon. The amount of the noble gas used can range from 1% to as high as 90% of the total gas composition. Even a value of more than 95% for example 99% can be used. In this embodiment the total gas composition including the precursor amount would be oxygen in an amount ranging from 0.01 to 25% and noble gas nitrogen mixture ranging from 99.99% until 75% with the amounts of nitrogen and noble gas as identified above. When using argon as noble gas, very good results have been obtained. Embodiments using only nitrogen as the inert gas besides the active gas can also advantageously be used.

Because of the fact, that pulsing reduces the formation of dust the power supply may be arranged to provide a periodic electrical signal with an on-time ($t_{on}$) and an off-time ($t_{off}$), the sum of the on-time and off-time being the period or cycle of the periodic electrical signal.

Figure 2:
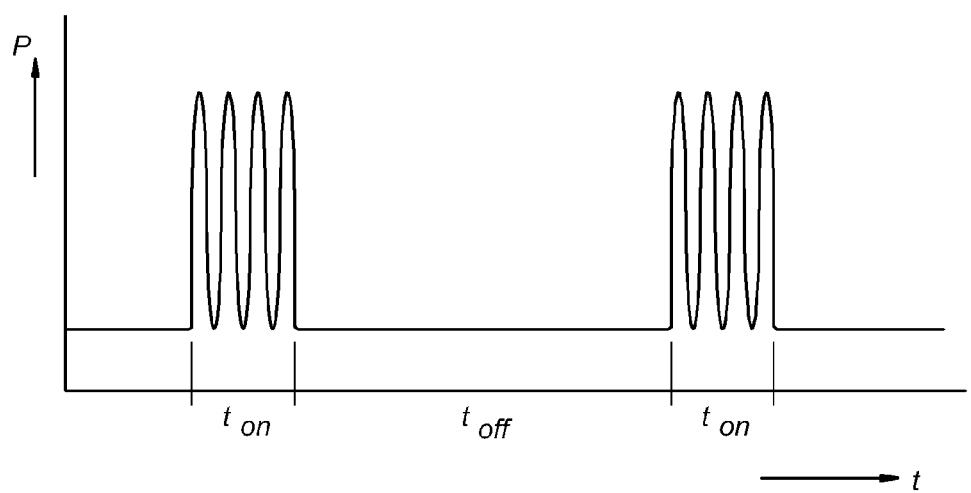
FIG. 2 shows a plot of a periodic signal generated by the power supply to feed the electrodes of the plasma generation of apparatus of FIG. 1.

The power supply (being a part of the plasma control unit 11 as described with reference to FIG. 1) can be a power supply providing a wide range of frequencies. For example it can provide a low frequency (f=10-450 kHz) electrical signal during the on-time. It can also provide a high frequency electrical signal for example f=450 kHz-30 MHz. Also other frequencies can be provided like from 450 kHz-1 MHz or from 1 to 20 MHz and the like. The on-time may vary from very short, e.g. 20 ms, to short, e.g. 500 ms. Because of the beneficial effect of nitrogen also an on-time of more than 500 ms can be used, for example 1 s. The on-time effectively results in a pulse train having a series of sine wave periods at the operating frequency, with a total duration of the on-time (e.g. 10 to 30 periods of a sine wave) of 0.1 to 0.3 ms. This is schematically shown in the graph of FIG. 2.

In another embodiment very short pulses are used in order to prevent the dust formation. Using these very short pulses, the dust formation is even further suppressed, while the deposition rate is kept at a high level because through the use of the gas compositions specified above a duty cycle of more than 10% can be realised.

By using very short on-times of the APG plasma, further charging of the particles is effectively prevented, allowing to control the chemical reactions in the treatment space 5 even more efficiently.

In case of the use of very short pulses the power on-time of the APG plasma is short enough not to cause additional charging of the reactive species, thus allowing a much more effective deposition process.

Pulsing the plasma with an off-time in the order of milliseconds is enough to interrupt the growth of dust particles and to limit thus the dust formation. For minimizing the density of dust coagulation centers the use of an interval between pulses ($t_{off}$) in the order of the time of residence of the gas in the treatment space 5 of a reactor can also advantageously be used in the present invention. In this case the time between pulses should be comparable to the residence time of the gas in the discharge space. In the case of argon/oxygen/HMDSO for example there are reactive species with a longer lifetime which need to be flushed before the start of the next pulse. A residence time which is shorter than the cycle time (sum of pulse on-time and pulse off-time) is on the safe side, the residence time should in any case be chosen such, that there is no accumulation of dust coagulation centers. In case of the inventive embodiments using nitrogen, the residence time can be enlarged to values which are higher than the cycle time. Residence times as high as 10 times the cycle times might be used in these embodiments.

The proposed pulsed plasma method is based on the suppression of formation of the dust coagulation centers from the initial phase during the power on-time ton. Furthermore, it is based on the decay of the dust coagulation centers by adjusting the power off-time ($t_{off}$) and by adjusting the gas composition. The total amount of coagulation centers seem to be determined by the amount of the precursor of the chemical compound or chemical element to be deposited in the plasma gas composition, and the gas mixture used, for example the percentage of oxygen and of course the gas flow as discussed above. In case the precursor amount in the gas mixture is reduced and/or the amount of reactive gas like oxygen, the amount of coagulation centers in the plasma gas will also be reduced. Reducing the precursor amount in the gas composition will off course influence the efficiency of the deposition process. Best results are obtained in general with a precursor concentration from 2 to 500 ppm of the gas composition and for example an oxygen concentration of e.g. 0.01% of the gas phase, or more, e.g. 2%, but less than 25% for example 10%.

In case of the inventive embodiments using nitrogen, an efficient way of controlling the generation of dust coagulation centers may be accomplished by having the power supply operate at a duty cycles in general from more than 1% or more than 5% for example 10%, 20%, 30%, 40%, 50%, 60% and even 98%, with short power on-times in the order of 0.05-0.5 ms. The power on-time ($t_{on}$) and power off-time ($t_{off}$) can be adjusted in order to maintain a large density of reactive radicals and an efficient deposition process but within the limits imposed by the above mentioned conditions.

Although oxygen as a reactive gas in this invention has a many advantages also other reactive gases might be used like for example hydrogen, carbon dioxide, ammonia, oxides of nitrogen, and the like.

In the present invention precursors can be can be selected from (but are not limited to): $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, or $Ru_3(CO)$ 12, Tantalum Ethoxide (Ta(OC2H5)5), Tetra Dimethyl amino Titanium (or TDMAT) SiH4 CH4, B2H6 or BCl3, WF6, TiCl4, GeH4, Ge2H6Si2H6 (GeH3)3SiH, (GeH3)2SiH2, hexamethyldisiloxane (HMDSO), tetramethyldisiloxane (TMDSO), 1,1,3,3,5,5-hexamethyltrisiloxane, hexamethylcyclotetrasiloxane, octamethylcyclotetrasiloxane, decamethylcyclopentanesiloxane, tetraethoxysilane (TEOS), methyltrimethoxysilane, methyltriethoxysilane, dimethyldimethoxysilane, dimethyldiethoxysilane, trimethylethoxysilane, ethyltrimethoxysilane, ethyltriethoxysilane, n-propyltrimethoxysilane, n-propyltriethoxysilane, n-butyltrimethoxysilane, i-butyltrimethoxysilane, n-hexyltrimethoxysilane, phenyltrimethoxysilane, vinyltrimethoxysilane, vinyltriethoxysilane, aminomethyltrimethylsilane, dimethyldimethylaminosilane, dimethylaminotrimethylsilane, allylaminotrimethylsilane, diethylaminodimethylsilane, 1-trimethylsilylpyrrole, 1-trimethylsilylpyrrolidine, isopropylaminomethyltrimethylsilane, diethylaminotrimethylsilane, anilinotrimethylsilane, 2-piperidinoethyltrimethylsilane, 3-butylaminopropyltrimethylsilane, 3-piperidinopropyltrimethylsilane, bis(dimethylamino)methylsilane, 1-trimethylsilylimidazole, bis(ethylamino)dimethylsilane, bis(butylamino)dimethylsilane, 2-aminoethylaminomethyldimethylphenylsilane, 3-(4-methylpiperazinopropyl)trimethylsilane, dimethylphenylpiperazinomethylsilane, butyldimethyl-3-piperazinopropylsilane, dianilinodimethylsilane, bis(dimethylamino)diphenylsilane, 1,1,3,3-tetramethyldisilazane, 1,3-bis(chloromethyl)-1,1,3,3-tetramethyldisilazane, hexamethyldisilazane, 1,3-divinyl-1,1,3,3-tetramethyldisilazane, dibutyltin diacetate, aluminum isopropoxide, tris(2,4-pentadionato)aluminum, dibutyldiethoxytin, butyltin tris(2,4-pentanedionato), tetraethoxytin, methyltriethoxytin, diethyldiethoxytin, triisopropylethoxytin, ethylethoxytin, methylmethoxytin, isopropylisopropoxytin, tetrabutoxytin, diethoxytin, dimethoxytin, diisopropoxytin, dibutoxytin, dibutyryloxytin, diethyltin, tetrabutyltin, tin bis(2,4-pentanedionato), ethyltin acetoacetonato, ethoxytin (2,4-pentanedionato), dimethyltin (2,4-pentanedionato), diacetomethylacetatotin, diacetoxytin, dibutoxydiacetoxytin, diacetoxytin diacetoacetonato, tin hydride, tin dichloride, tin tetrachloride, triethoxytitanium, trimethoxytitanium, triisopropoxytitanium, tributoxytitanium, tetraethoxytitanium, tetraisopropoxytitanium, methyldimethoxytitanium, ethyltriethoxytitanium, methyltripropoxytitanium, triethyltitanium, triisopropyltitanium, tributyltitanium, tetraethyltitanium, tetraisopropyltitanium, tetrabutyltitanium, tetradimethylaminotitanium, dimethyltitanium di(2,4-pentanedionato), ethyltitanium tri(2,4-pentanedionato), titanium tris(2,4-pentanedionato), titanium tris(acetomethylacetato), triacetoxytitanium, dipropoxypropionyloxytitanium, dibutyryloxytitanium, monotitanium hydride, dititanium hydride, trichlorotitanium, tetrachlorotitanium, tetraethylsilane, tetramethylsilane, tetraisopropylsilane, tetrabutylsilane, tetraisopropoxysilane, diethylsilane di(2,4-pentanedionato), methyltriethoxysilane, ethyltriethoxysilane, silane tetrahydride, disilane hexahydride, tetrachlorosilane, methyltrichlorosilane, diethyldichlorosilane, isopropoxyaluminum, tris(2,4-pentanedionato)nickel, bis(2,4-pentanedionato) manganese, isopropoxyboron, tri-n-butoxyantimony, tri-n-butylantimony, di-n-butylbis(2,4-pentanedionato)tin, di-n-butyldiacetoxytin, di-t-butyldiacetoxytin, tetraisopropoxytin, zinc di(2,4-pentanedionate), and combinations thereof. Furthermore precursors can be used as for example described in EP-A-1351321 or EP-A-1371752. Generally the precursors are used in a concentration of 2-500 ppm e.g. around 50 ppm of the total gas composition.

In another aspect of this invention the plasma gas including the precursor to be deposited via atmospheric pressure glow discharge plasma is brought into contact with two resin substrate $6a$, $6b$ rolls synchronously via one device as can be seen in FIG. 1. This step will result in less consumption of precursor and/or carrier materials and as such to much more efficient application of plasma gas including precursor to be used onto the substrates $6a$, $6b$, which is from economical point and commercialization of view preferred. The figure is only illustrative for plasma gas contacting two rolls of resins synchronously, it may be understood that the method may include also the use of a remote plasma device and jetting the plasma gas including the precursor element to be deposited onto the 2 resin rolls synchronously. Further the use of atmospheric pressure glow discharge avoids the use of complex and expensive vacuum equipment which is preferred in order to make the process simpler and more cost-effective. Although the mechanism is not quite understood we believe that this improvement is related to far much better uniform and dense deposition of precursor element related to the use of our atmospheric pressure discharge.

As a result of the deposition on each substrate $6a$, $6b$ an inorganic barrier 14 is formed with a thickness of 10 nm to 1 µm, preferably 20 nm to 300 nm and more preferably 50 nm to 200 nm.

Each inorganic barrier layer will display typically a water vapour transmission rate (WVTR) of about 0.03 g/m$^2$·day before the lamination step of this invention, which lamination step is described in more detail below using the embodiment of FIG. 3.

Figure 3:
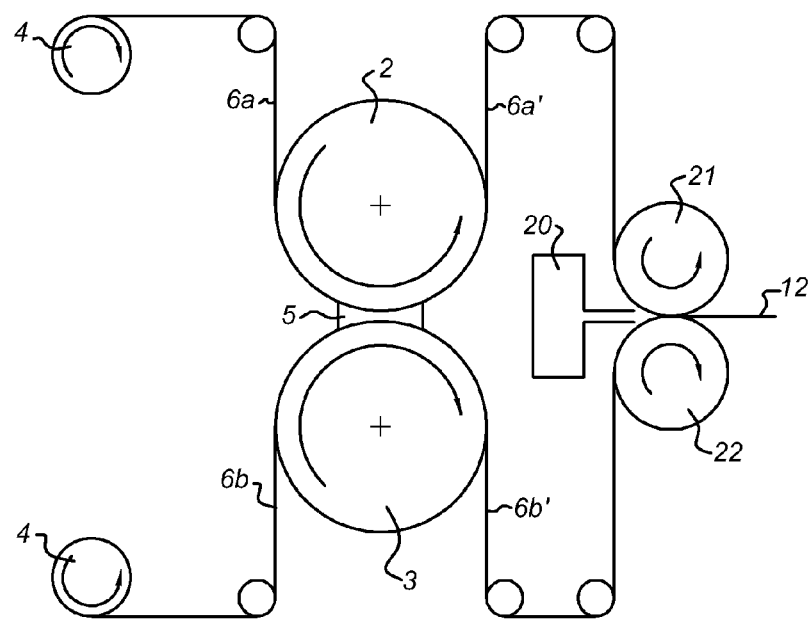
FIG. 3 shows a schematic view of an embodiment involving a 2-rolls-to-1-roll process.

In FIG. 3 the lamination process is shown according an embodiment of this invention. The pair of inorganic barrier layers $6a'$, $6b'$ are suitably bonded or laminated together with an adhesive 15 on the inorganic barrier 14 side facing each other. In the embodiment shown in FIG. 3 this is accomplished by first forming two substrates $6a'$, $6b'$ with an inorganic barrier layer 14 in a single treatment space 5, similar to the embodiment of FIG. 1. The treated substrates $6a'$, $6b'$ are then fed to two laminating rollers 21, 22, and an adhesive material is applied the to inorganic layer side of substrates $6a'$, $6b'$ using an adhesive applicator 20. The laminating rollers 21, 22 are arranged to provide heat or radiation to the adhesive material between the treated substrates $6a'$, $6b'$, in order to cure or modify the adhesive material to form an adhesive layer 15.

As a result a multi layer stack structure 12 is obtained having an excellent barrier for water vapour. In one particular embodiment of this invention already excellent barrier properties were observed in the case when one [resin layer-inorganic]-layer stack combination $6a$ is adhered to another one [inorganic-organic]-layer stack combination $6b$ using an adhesive 15 between the two opposing face related inorganic barrier coatings 14 resulting in a multi layer stack structure 12 comprising the following layers as shown in cross section in FIG. 4a: i) organic resin (substrate $6a$); ii) an inorganic barrier 14; iii) an adhesive 15; iv) an inorganic barrier 14 and v) an organic resin (substrate $6b$). Also indicated are the semi-products $6a'$, $6b'$ each comprising a substrate $6a$, $6b$ and a barrier layer 14.

In this particular embodiment the laminate structure may display a typical water vapour transmission rate (WVTR) of $7*10^{-4}$ g/m$^2$·day.

It may be well understood that as a result of the 2-rolls-to-1-roll operation as described above in relation to FIG. 3, a further product multi-layer stack structure 12 can be prepared by using each produced multi-layer stack structure 12 as a starting substrate roll(s) in another separate 2 roll-to-1 roll operation step. The separate structures 12 are laminated using an additional adhesive layer 16 as shown in the cross sectional view of FIG. 4b. As a result a thicker multi-stack layer structure may be prepared comprising i) [organic resin-inorganic barrier-adhesive-inorganic barrier-organic resin layer-adhesive]$_n$ layers and ii) [organic resin-inorganic barrier-adhesive-inorganic barrier-organic resin layer], layer where n is an integer larger than 0. As a result even better barrier properties may be observed for these types of multi-stack layer structures.

Adhesives 15, 16 that may be applied for bonding the inorganic barrier layers 14 include all suitable thermoplastic- and elasto-plastic polymers; polymers which are curable by radiation such as by ultraviolet or electron-beam, by heat, by chemical initiators or by combinations thereof; organic or organic-containing adhesives, such as acrylics, urethanes, epoxides, polyolefins, organosilicones and others; and products of plasma-polymerization, oligomerization, or curing of organic-, organosilicon and other organometallic compounds, either volatile or deposited by other means such as spraying, sputtering, casting or dip-coating.

Figure 4A:
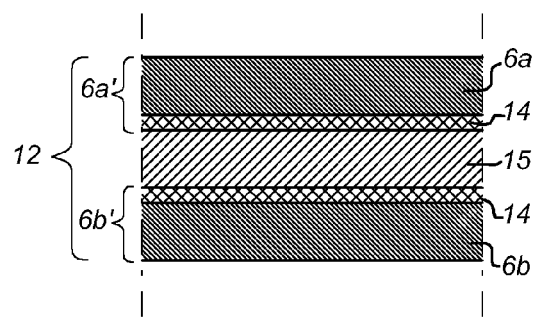
FIGS. 4a and 4b shows cross sectional views of structures according to embodiments of the present invention.
Figure 4B:
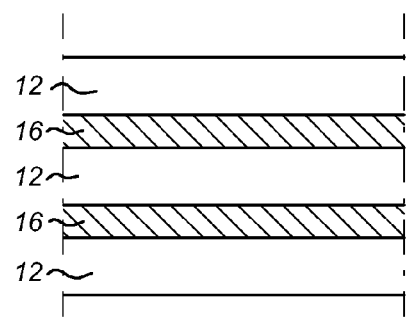

The adhesive forms an adhesive layer 15 bonding the two opposing faces of inorganic barrier layers 14 in the embodiment of FIG. 4a and an additional adhesive layer 16 bonding two substrates 6a, 6b of different multi-layer stack structures 12 in the embodiment of FIG. 4b. The adhesive layer 15, 16 may suitably have a thickness of 50 nm to 1000 μm, preferably from 100 nm to 100 μm.

The multi-layer stack structures 12 may be applied in several devices as under- or over-layer protection means. Preferred use of these multi-layers is in protecting OLEDs by using these multi-layers enveloping the OLED-devices.

The multi-layer material (single or multiple multi-layer stack structures 12) according to the invention may be used also in other types of devices, such as liquid crystal displays or in organic photovoltaic devices, which are known in prior art to require transparent materials impermeable to oxygen and water vapour.

EXAMPLES

As a substrate material 6a, 6b optical grade PEN was used having a thickness of 90 micron. WVTR of the PEN substrate without coating was quantified by Mocon Aquatran and is typically 0.27+/−0.03 g/m2·day.

Comparative Example

Typically 100 nm thick inorganic layers were deposited on optical grade PEN sheets using a low vacuum ICP plasma enhanced CVD process using argon, HMDSO and oxygen.

The layer thickness of 100 nm $SiO_2$ was quantified by Spectroscopic Ellipsometry (Woollam M-2000) and the WVTR was quantified by Mocon Aquatran. The WVTR of the barrier samples was typically 0.1 g/m$^2$·day (at 20 C and 60% RH).

Subsequently two barrier films were laminated face to face (barrier to barrier) using a test-laminator with a UV curable hydrophobic acrylate and UV-cured. The acrylate layer has a thickness of typically 10 micron.

Consequently, the WVTR is measured of the laminate structure using the Mocon Aquatran. The WVTR obtained is typically 0.01 g/m$^2$·day.

Example 1

Two barrier films 14 of 50 nm thick are deposited synchronously using the electrode set-up as shown in FIG. 1 using an atmospheric pressure plasma device 10. On both sides of the substrates 6a, 6b facing the plasma discharge a SiOx layer 14 is deposited. Directly, after depositing the inorganic layer 14 the two substrates 6a', 6b' are brought together and laminated with the same hydrophobic acrylate as above with a thickness of 10 micron followed by UV-curing. Under the same conditions more barrier samples are produced and part of this material is prepared for permeability characterization by Mocon.

The WVTR of the individual layers 6a', 6b' is typically 0.03 g/m$^2$·day, whereas the permeability of the laminate structure 12 is typically less than $1*10^{-3}$ g/m$^2$·day.

Example 2

Two barrier films 14 of 100 nm thick are deposited in one time using the electrode set-up as shown in FIG. 1. On both sides of the substrates 6a, 6b facing the plasma discharge a SiOx layer 14 is deposited. Directly, after depositing the inorganic layer 14 the two substrates 6a', 6b' are brought together and laminated using the same thickness and same acrylate layer 15.

Under same conditions more barrier samples are produced, part of this material is sampled for permeability characterization by Mocon.

WVTR of the individual layers 6a', 6b' is typically 0.03 g/m$^2$·day, whereas the permeability of the laminate structure 12 is below the detection limit of the Mocon Aquatran.

Subsequently, the permeability is characterized by the calcium corrosion test. This method allows characterization of the average WVTR as low as $10^{-5}$ to $10^{-6}$ g/m$^2$·day at 40° C./90% RH. The WVTR for the multi-layer stack structure 12 was found to be typically in the order of $10^{-4}$ g/m$^2$·day.

Moreover the method can be used too to evaluate defect resolved calcium corrosion. By repeatedly measuring the development of the defects it was observed by optical microscopy that very small defects tend to appear after more than 500 hours. However, defects remain very small, i.e. there is no growth of the defects and as a matter of fact defects remain so small that they are not visible by naked eye.

The invention claimed is:

1. A method for manufacturing a multi-layer stack structure comprising in order: a first substrate; a barrier layer; an adhesive layer; a barrier layer; and a second substrate (6b), the method comprising:
   a) providing two substrates in a single treatment space formed between at least two electrodes for generating an atmospheric pressure glow discharge plasma in the single treatment space;
   b) treating the facing surfaces of the two substrates simultaneously in the single treatment space;
   c) laminating the two treated substrates with an adhesive layer between the facing surfaces to obtain the multi-layer stack structure.

2. The method according to claim 1, further comprising laminating two or more multi-layer stack structures with an additional adhesive layer in between.

3. The method according to claim 1, in which the two substrates are provided as sheets to obtain the multi-layer stack structure in a continuous process.

4. The method according to claim 1, in which the substrates are organic resin films.

5. The method according to claim 1, in which treating the facing surfaces comprises depositing an inorganic material on the substrate surface to form the barrier layer.

6. The method according to claim 1, in which treating the facing surfaces is executed with a duty cycle above 10%.

7. The method according to claim 6, in which treating the facing surfaces is executed with a duty cycle above 60%.

8. The method according to claim 1, in which the atmospheric pressure glow discharge is generated by applying electrical power from a power supply to the at least two electrodes in the treatment space during an on-time ($t_{on}$), the treatment space being filled with a gas composition, including a precursor of the chemical compound or element to be deposited, wherein the gas composition comprises an amount of nitrogen between 1 and 99.99% and an amount of oxygen between 0.01 and 25%.

9. A device comprising a multi-layer stack structure obtained according to the method of claim 1.

10. A device according to claim 9 which is an OLED device.

11. An apparatus for producing a multi-layer stack structure, the apparatus comprising a treatment space with at least two electrodes connected to a plasma control unit for generating an atmospheric pressure glow discharge plasma in the treatment space, and a gas supply device in communication with the treatment space for providing compounds in the treatment space, in which the treatment space is a single treatment space formed between the at least two electrodes, and the apparatus further comprises:

a feeder system for providing two substrates simultaneously in the single treatment space for treatment using the generated atmospheric pressure glow discharge plasma, and a laminating system for laminating the two treated substrates with an adhesive layer in between.

12. The apparatus according to claim 11, in which the feeder system comprises rolls, and the at least two electrodes comprise cylinder type electrodes.

* * * * *